United States Patent [19]

Okinaga et al.

[11] Patent Number: 4,943,843
[45] Date of Patent: Jul. 24, 1990

[54] SEMICONDUCTOR DEVICE

[75] Inventors: Takayuki Okinaga, Akishima; Hiroshi Tachi, Ohme; Hiroshi Ozaki, Kokubunji; Kanji Otsuka, Higashiyamato; Michiaki Furukawa, Fucyu; Yasuyuki Yamasaki, Kodaira, all of Japan

[73] Assignees: Hitachi Ltd.; Hitachi VLSI Engineering Corp., both of Tokyo, Japan

[21] Appl. No.: 445,942

[22] Filed: Dec. 8, 1989

Related U.S. Application Data

[63] Continuation of Ser. No. 240,605, Sep. 6, 1988, abandoned, which is a continuation of Ser. No. 845,332, Mar. 21, 1986, abandoned.

[30] Foreign Application Priority Data

Mar. 25, 1985 [JP] Japan .................... 60-58407

[51] Int. Cl.$^5$ .................... H01L 23/48; H01L 23/50; H01L 23/12
[52] U.S. Cl. .................... 357/70; 357/68
[58] Field of Search .................... 357/68, 70; 174/52.4

[56] References Cited

U.S. PATENT DOCUMENTS

| 3,444,440 | 5/1969 | Bell et al. | 357/70 X |
| 3,708,730 | 1/1973 | Shierz et al. | 357/70 X |
| 4,048,438 | 9/1977 | Zimmerman | 357/70 X |
| 4,246,595 | 1/1981 | Noyori et al. | 357/70 |
| 4,595,945 | 6/1986 | Graver | 357/70 |
| 4,612,564 | 9/1986 | Moyer | 357/70 |

FOREIGN PATENT DOCUMENTS

| 0105970 | 9/1978 | Japan | 357/70 |
| 57-114261 | 7/1982 | Japan . | |
| 57-201956 | 11/1982 | Japan . | |
| 0192354 | 9/1983 | Japan | 357/70 |
| 0143541 | 11/1983 | Japan | 357/70 |
| 0171733 | 9/1985 | Japan | 357/70 |

Primary Examiner—Rolf Hille
Assistant Examiner—S. V. Clark
Attorney, Agent, or Firm—Antonelli, Terry, Stout & Kraus

[57] ABSTRACT

According to the present invention, as improvement in the adhesion of inner leads with a packaging resin in a resin-sealed semiconductor device is attained by spreading leads on or near the circuit-forming face of a pellet, or on or near the main non-circuit-forming face of the pellet to extend the lengths of the inner leads on or under the pellet.

38 Claims, 4 Drawing Sheets

SEMICONDUCTOR DEVICE

This application is a continuation of application Ser. No. 240,605, filed Sept. 6, 1988, which is a continuation of application Ser. No. 845,332, filed Mar. 21, 1986, both now abandoned.

BACKGROUND OF THE INVENTION

The present invention relates to a technique that is especially applicable for providing an electrical connection to a pellet in a resin-sealed semiconductor device.

Figure 8:
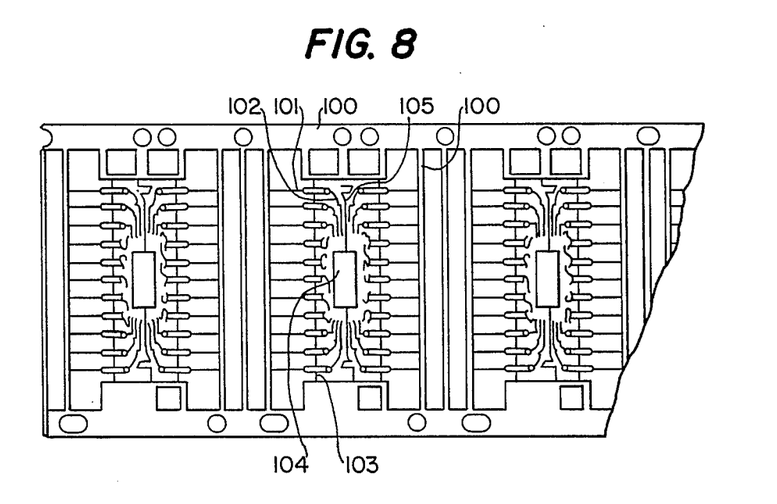
FIG. 8 is a plan view of a lead frame used in the production of a conventional resin-sealed semiconductor device.

FIG. 8 is a plan view of a conventional lead frame, which is used in the production of a conventional resin-sealed semiconductor device, specifically a resin-sealed type of 64 KSRAM (memory) LSI. In the figure, the numeral 100 indicates a frame, 101 an outer frame, 102 an inner lead, 103 a tie bar, 104 a tab, and 105 a tab lead.

In the resin-sealed semiconductor device, there is a tendency that the distance between the side end of a package and the tab, which is a pellet mounting part, becomes increasingly narrower with a trend of the pellet size being increased. This is attributed to the fact that the size of a package for pellets is standardized and, hence, cannot be enlarged despite the increasing size of the pellet.

As a result, it is anticipated that, since this may entail largely lowered adhesion of so-called short leads which are structurally short lengths of the portions of the leads as external terminals where the leads are embedded within a resin constituting the package, the leads are liable to easily fall off and peeling is liable to occur between the leads and the resin during bending work of the lead.

The inventors of the present invention have found that this may lead to poor electrical connection, reduction in moisture resistance, etc., to reduce the reliability of the semiconductor device.

Resin-sealed semiconductor devices are described in "IC-Ka Jisso Gijutsu", pp. 149–150, edited by Nihon Microelectronics Society and published by Kogyo Chosakai Publishing Co., Ltd. on Jan. 15, 1980.

SUMMARY OF THE INVENTION

An object of the present invention is to provide a technique which serves to remarkably improve the adhesion of a resin of a package with the leads in a resin-sealed semiconductor device, especially in a semiconductor device on which a large semiconductor pellet is mounted.

The aforementioned and other objects and novel features of the invention will become apparent from the following description and the accompanying drawings.

An outline of a representative embodiment of the invention will now be briefly described.

Specifically, an improvement in adhesion between inner portions of the leads and a resin constituting a package is achieved by spreading a lead on or near the circuit-forming face of a pellet to be mounted, or on or near the main non-circuit-forming face of the pellet in a resin-sealed semiconductor device to enable the inner portion of the lead; i.e., the portion embedded in the resin, to be elongated and thereby provide a greater contact area with the resin.

BRIEF DESCRIPTION OF THE DRAWINGS

The aforementioned and other objects and novel features of the present invention will become apparent from the following description taken with reference to the accompanying drawings in which.

DESCRIPTION OF THE PREFERRED EMBODIMENTS

Example 1

Figure 1:
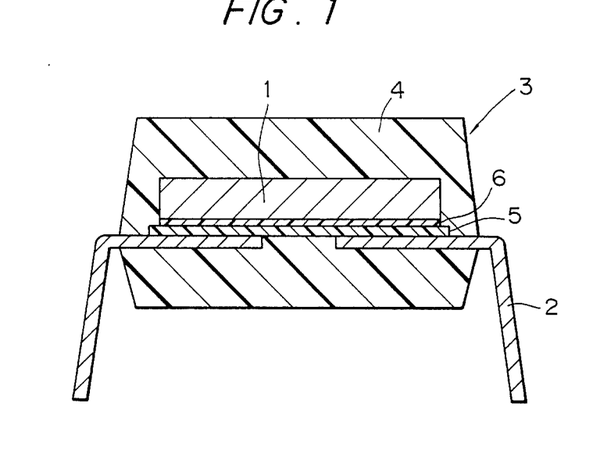
FIG. 1 is a cross-sectional view taken along line I-I in FIG. 2 showing a semiconductor device of Example 1 according to the present invention.
Figure 2:
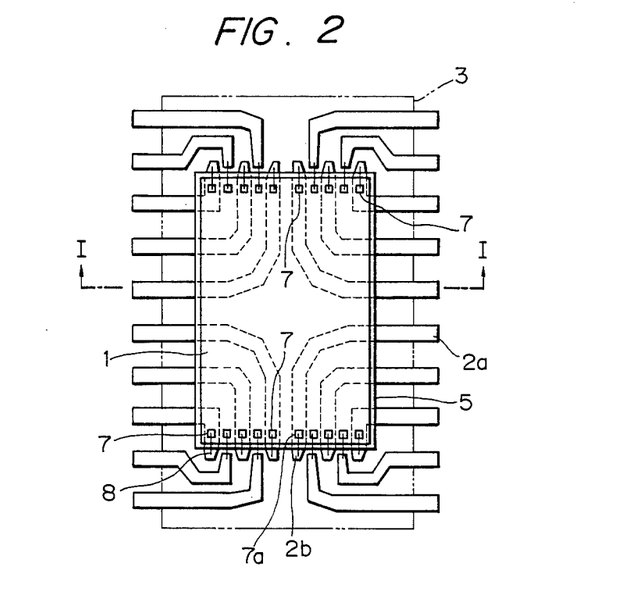
FIG. 2 is a plan view showing the relation of a pellet and the leads of the semiconductor device of Example 1.

FIG. 1 is a cross-sectional view taken along line I—I in FIG. 2 showing a semiconductor device of Example 1 according to the present invention. FIG. 2 is a plan view showing the relation of a pellet and the leads of the semiconductor device of Example 1.

The semiconductor device of Example 1 is a so-called resin-sealed semiconductor device. Specifically, the semiconductor pellet 1 is embedded together with the inner portions of the leads 2, which portions of the leads 2 serve as external terminals in a resin 4 constituting a package 3, such as an epoxy resin (hereinafter referred to as "packaging resin"), and the outer portions of the leads 2 outside the package are bended downward near the side ends of the package 3.

In a conventional resin-sealed semiconductor device, a pellet is attached to a tab, which serves as a mounting board having substantially the same size as that of the pellet, and bonding pads, which serve as the electrodes of the pellet, are electrically connected with the inner end portions of the leads disposed at the periphery of the tab via fine metallic wires which serve as bonding wires.

By contrast, in the semiconductor device of Example 1, the leads are spread (i.e., arranged to extend in an elongated manner) on the reverse side of the pellet 1 (namely, the main non-circuit-forming face on which no semiconductor integrated circuit is formed). The pellet is attached via an adhesive 6 to an insulating sheet 5 of a polyimide resin bonded to the leads. In this case, the lead frame has no tab which serves as the pellet mounting part. The insulating sheet 5 serves to provide electrical insulation between the leads. In this Example, if there were no insulating sheet 5, an electrical short circuit would be produced between the leads by the conductive pellet 1. In order to avoid the electrical short circuit, the insulating sheet 5 is disposed between the pellet 1 and the leads.

As shown in FIG. 2, the positional relation of the above-mentioned pellet 1 and the leads 2 is such that the inner portions of the leads 2a whose outer portions are disposed along the sides of the pellet 1 near which no bonding pads 7 are formed in the arrangement (hereinafter referred to also as "non-bonding pad-forming sides") are spread on the reverse side (main non-circuit-forming face) of the pellet 1, and that the tip portions 2b of the leads are spread up to the positions exceeding the sides of the pellet near which bonding pads 7 are formed in the arrangement. The insulating sheet 5 is bonded onto the leads 2a, and the pellet 1 is attached on the upper face of the insulating sheet 5 with the main non-circuit-forming face disposed on the lower side.

In the conventional resin-sealed semiconductor devices, the position where the leads, corresponding to the leads 2a of the invention having the inner lead portions spread under the pellet 1, are embedded in the packaging resin is the region of the packaging resin where the inner lead portions (those portions of the leads which are embedded in the packaging resin) can merely secure an extremely limited short length ranging from the side end of the package to the proximity of the tab; namely, the place where the short leads are provided.

The conventional short leads usually cause a problem in that they are liable to fall off from the package because of low tensile strength attributed to small bonding areas thereof shared with the package resin. Since the bonding areas shared by the short leads and the packaging resin are reduced with an increasing size of the pellet, this problem has become serious with an increase in the pellet size.

By contrast, since the inner portions of the leads 2a provided in the places corresponding to the positions of the above-mentioned short leads are very long; i.e., these portions are elongated, in the semiconductor device of Example 1, the bonding areas thereof shared with the packaging resin are large. Thus, the bonding strength between the leads and the packaging resin can be largely improved. Therefore, peeling in the interface between the leads and the packaging resin which may occur in bending work of the outer portions of the leads or the like can be effectively prevented even in a semiconductor device in which a large pellet is used, thus avoiding intrusion of water up to the pellet in the packaging resin through the peeled portion from the outside. Thus, the moisture resistance of the semiconductor device can be improved. Furthermore, since the insulating sheet 5 is strongly bonded to the leads 2a, the latter have a very high tensile strength.

Moreover, since the leads 2a, formed of a metallic material having higher heat conductivity and heat dissipating ability than the packaging resin, are attached to the pellet 1 over a wide range of the face thereof though the attachment made via the insulating sheet 5, the heat generated in the pellet in an operating state can be directly dissipated toward the outside via the leads. Thus, the semiconductor device of the present invention is one having a structure with an excellent heat dissipating ability.

Besides, since the electrical connection of the pellet 1 with the leads 2a is achieved by wire-bonding the bonding pad 7a in the pellet 1 with the tip portions 2b of the leads 2a spread near them and near the sides of the pellet, the bonding wires 8 can be shortened. Therefore, a contact accident between mutually adjacent bonding wires, between a bonding wire and an adjacent lead, or between a bonding wire and the pellet can be prevented. In other words, occurrence of a short circuit accident can be prevented. Further, the amount of the wires 8 can be decreased due to the small length of the bonding wires, thus attaining cost reduction.

The semiconductor device of Example 1 is easily prepared by forming a lead frame for predetermined shapes of leads, bonding an insulating sheet 5 in the predetermined portions of the inner portions of the leads, attaching a pellet 1 to the insulating sheet 5 via an adhesive, effecting wire-bonding of the bonding pads 7 of the pellet 1 with the bonding parts of the leads, and following the same assembly step as in the case of the conventional resin-sealed semiconductor device. In this case, the insulating sheet 5 not only serves as an insulator for preventing a short circuit accident between the leads, but also plays a role of reinforcing the lead frame in respect of the mechanical strength thereof.

The wire-bonding parts of the above-mentioned leads can be formed by depositing gold according to, for example, the partial plating method.

Figure 3:
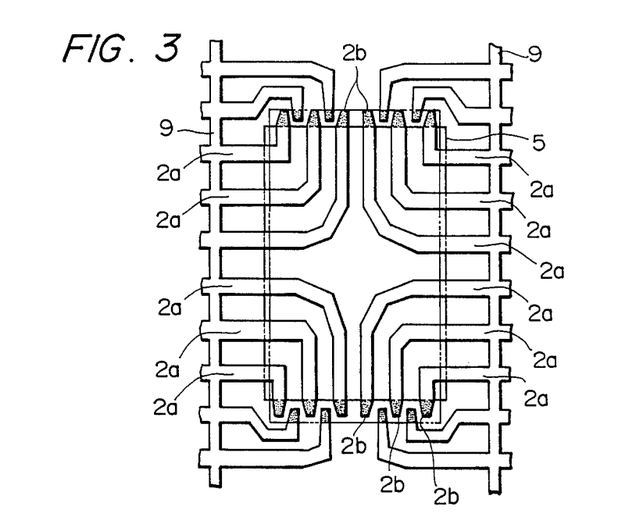
FIG. 3 is a partial plan view of a lead frame used in the semiconductor device of Example 1, and shows a state of the frame in the step of plating.

FIG. 3 is a partial plan view of the lead frame having the insulating sheet 5 bonded thereto in the portion thereof substantially inside the tie bar 9. The lead frame portions not shown in the figure, for example, the frame portion and the outer lead portion, have shapes similar to those of a lead frame shown in FIG. 8. In the semiconductor device of Example 1, since the insulating sheet 5 itself functions as a partial plating mask, use of only a partial plating mask having an opening as shown by the dot mark domain in FIG. 3 makes it possible to effect selective partial plating of a material having excellent wire bonding ability, such as gold (Au), in only the tip portions 2b of the leads 2. Therefore, in the case of effecting partial plating, the mask preparation process is simplified, thus enabling easy formation of the bonding parts.

In FIG. 3 a mask providing spaces only along the short sides of the pellet is shown. However, use of a mask having an opening also providing spaces along the long sides of the pellet parallel to the tie bars 9 makes it possible to easily effect partial plating on the leads all around the insulating sheet 5. In this way, a semiconductor device having pellet whose periphery is provided all along with bonding pads can be easily prepared.

Example 2

Figure 4:
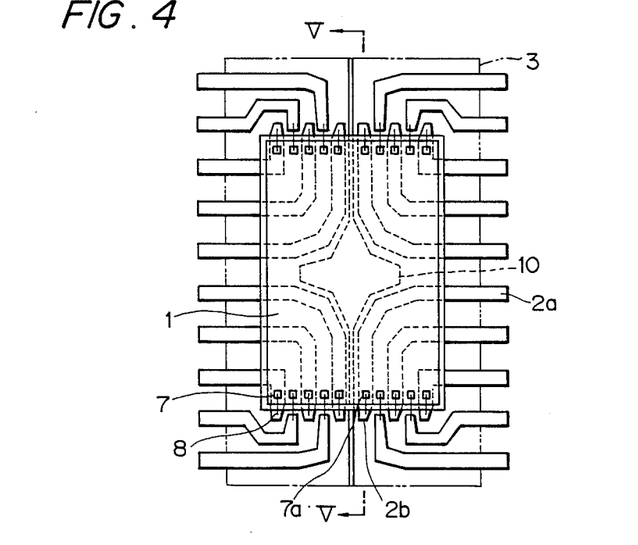
FIG. 4 is a plan view showing the relation of a pellet and the leads of a semiconductor device of Example 2 according to the present invention.

FIG. 4 is a plan view showing the relation of a pellet and leads of a semiconductor device of another Example according to the present invention.

The semiconductor device of Example 2 is different from that of Example 1 in that no insulating sheet 5 is used and that a smaller tab than the pellet 1 is used.

Specifically, in the semiconductor device of Example 2, the pellet 1 is attached, via an adhesive 11 of an insulating material, to the tab and the inner portions 2b of leads 2a whose outer portions are arranged along the non-bonding pad-forming sides of the pellet. Usable adhesives of insulating materials include polyimide resins, silicone rubbers, and ceramics.

In Example 2, since there is no insulating sheet 5, heat can be directly dissipated from the pellet 1. Thus the heat resistance is further lowered as compared with that in Example 1 and, hence, the reliability is correspondingly higher.

Furthermore, since the tab 10 is attached, the pellet attachment strength is also secured.

Figure 5:
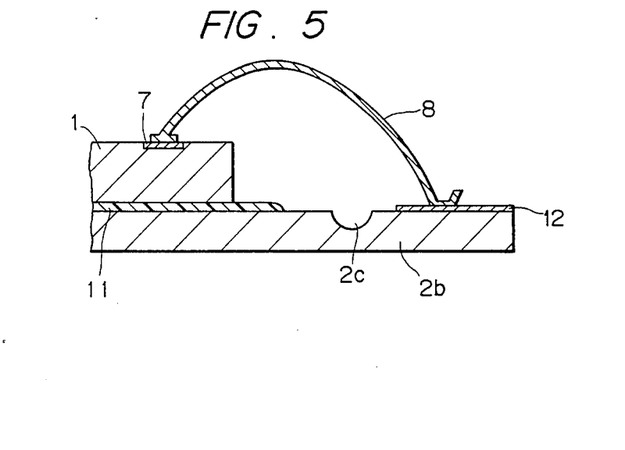
FIG. 5 is a partial cross-sectional view taken along line V—V in FIG. 4 showing the internal structure of the semiconductor device of Example 2.

FIG. 5 is a partial cross-sectional view showing the state of electrical connection of the pellet 1 with the tip portions of the leads 2 in the view taken along line V—V in FIG. 4. A recess 2c is formed in the tip portion 2b of a lead 2a. In bonding of the pellet 1 with the adhesive 11, since the adhesive 11 may flow out to contaminate the surface of the bonding part 12, bonding of the bonding pad 7 of the pellet 1 and the bonding part 12 with a wire 8 cannot sometimes be effected. The above-mentioned recess 2c is provided as a dam serving to intercept the flow of the adhesive 11 for avoiding the occurrence of failure of the bonding.

Example 3

Figure 6:
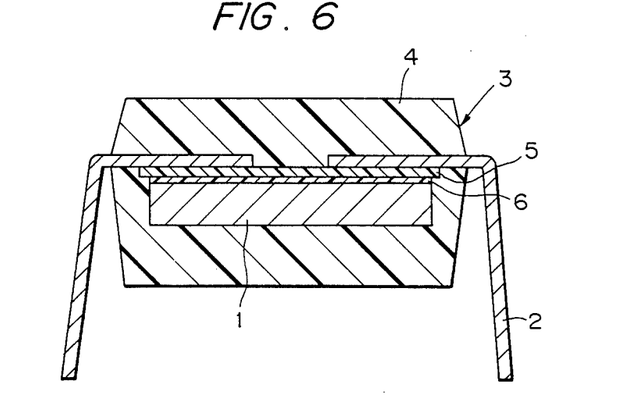
FIG. 6 is a cross-sectional view taken along line VI—VI in FIG. 7 showing a semiconductor device of Example 3 according to the present invention.
Figure 7:
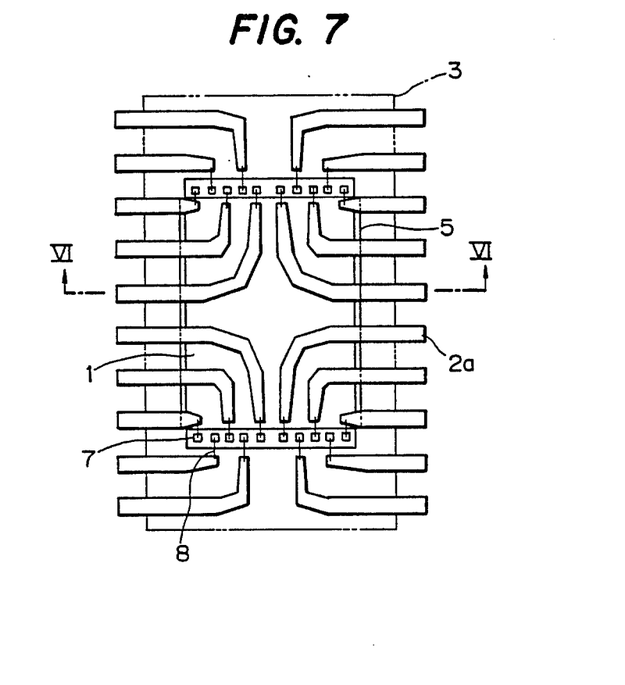
FIG. 7 is a plan view showing the relation of a pellet and leads of the semiconductor device of Example 3.

FIG. 6 is a cross-sectional view of a semiconductor device of still another Example according to the present invention. FIG. 7 is a plan view showing the relation of a pellet and leads in the above-mentioned semiconductor device.

The semiconductor device of Example 3 is different from those of Examples 1 and 2 in that the inner portions of the leads are spread on the circuit-forming face of the pellet.

Specifically, as shown in FIG. 6, the pellet 1 is attached, via an adhesive 6, onto the circuit-forming face of the pellet via an insulating sheet 5 of a polyimide resin bonded onto the reverse face of the inner portions of the leads. In this case, the insulating sheet 5 functions as an insulator for preventing a short circuit accident between the leads. Besides, the insulating sheet 5 plays a role of reinforcing the leads in respect of the mechanical strength thereof.

As shown in FIG. 7, the insulating sheet 5 has such a size that it does not cover the bonding pads of the pellet 1 bonded thereto. The inner portions of the leads 2a having outer portions arranged along the non-bonding pad-forming sides of the pellet are spread on the upper face of the insulating sheet. The inner portions of the leads 2a are bonded to the above-mentioned insulating sheet 5a with the tip portions thereof positioned short of the bonding pads.

Since the semiconductor device of Example 3 has the inner portions of the leads bonded on the side of the circuit-forming face of the pellet 1, it is superior in heat dissipating ability to the device of Example 1.

The polyimide resin of the insulating sheet 5 serves to prevent a semiconductor element from malfunctioning when the semiconductor device is irradiated with $\alpha$ rays from outside. Namely, the insulating sheet 5 plays a role of blocking the $\alpha$ rays intruding the device from outside to intercept irradiation of the semiconductor element with the $\alpha$ rays. Since the insulating sheet covers the circuit-forming face, an improvement in reliability against $\alpha$ rays is attained, too.

In a semiconductor device having an insulating film applied as the passivation film protecting the electric wiring and circuit portions on the circuit-forming face of the pellet 1, the insulating sheet for preventing short circuit between the leads may be unnecessary, or not only an insulating material but also a conductive material can be used as the adhesive for bonding the pellet to the leads and, if necessary, to the tab.

In Example 3, the tip portions 2b of the leads 2a are disposed in the inner positions short of the bonding pads 7, the positional relation therebetween is inversed in comparison with that in Example 1. Thus, the bonding direction is inversed, too. However, the bonding distance is substantially the same as in Example 1.

The effects of the present invention are as follows.

(1) In the resin-sealed semiconductor device, the spread of inner portions of leads on or near the circuit-forming face of a pellet mounted in the device, or on or near the main non-circuit-forming face of the pellet can greatly improve the adhesion of the inner portions of the leads with the packaging resin. Therefore, even where a large pellet is mounted, the leads can be prevented from falling off from the packaging resin.

In the present invention, at least one of the inner portions of the leads is spread on or under the pellet. As a result, the adhesion of the inner portions with the packaging resin can be greatly improved. Therefore, even where a large pellet is mounted, leads can be prevented from falling off from the packaging resin.

(2) For the same reason as mentioned in (1) above, occurrence of peeling in the bonding face between the leads and the packaging resin can be prevented in the bending work of the outer portions of the leads.

(3) For the reasons as mentioned in (1) and (2) above, even in the case of a semiconductor device having a small package and a large pellet mounted therein, there can be provided a highly reliable semiconductor device excellent in moisture resistance.

(4) When the inner portions of the leads are attached onto the main non-circuit-forming face of the pellet, heat generated in an operating state can be effectively dissipated through the leads toward outside.

(5) When an insulating sheet is provided between the pellet and the inner leads in the device as mentioned in (4) above, the attachment strength of the pellet can be improved.

(6) The structure as mentioned in (5) above can be easily formed by preparing a lead frame having an insulating sheet bonded thereto in a predetermined portion thereof and attaching a pellet onto the insulating sheet.

(7) Since the leads can be reinforced by bonding the insulating sheet to the lead frame in the predetermined portion thereof, the lead frame can be easily handled even if it includes a large number of fine leads.

(8) A combination of the lead frame having the insulating sheet bonded thereto in the predetermined portion thereof and a partial plating mask having an opening with a size providing a space(s) all or partially around the insulating sheet enables the portions of the leads corresponding to the above-mentioned space(s) to be easily subjected to partial plating since the insulating sheet functions as a mask of partial plating, too.

(9) Attachment of the inner portions of the leads onto the circuit-forming face of the pellet enables heat generated in the circuit in an operating state to be more directly dissipated through the leads.

(10) Provision of the insulating sheet, which serves to intercept irradiation of semiconductor elements with $\alpha$ rays between the inner leads and the pellet can protect the semiconductor elements and a circuit including the same from the $\alpha$ rays. Thus the reliability of the semiconductor device against $\alpha$ rays can be improved.

(11) When the leads attached onto the circuit-forming face or non-circuit-forming face of the pellet are provided with recesses or protrusions in the positions thereof close to the pellet mounting parts thereof, an adhesive for bonding them to the pellet or the insulating sheet for attachment of the pellet thereto can be prevented from flowing out to contaminate the surfaces of the bonding parts. Thus occurrence of poor wire-bonding can be prevented.

The invention completed by the present inventors has been specifically described with reference to Examples. However, the present invention is not limited to the above-mentioned Examples and is, needless to say, capable of various modifications within a range where they are not deviated from the subject matter of the present invention.

For example, all Examples concern the case where the inner portions of the leads are directly or indirectly attached onto the main face of the pellet. However, the present invention is not limited to this case. All or part of the inner portions of the leads may be spread near the circuit-forming face or the main non-circuit-forming face. Moreover, although the inner portions of the leads are shown spread along an arcuate or angled path with linear sections being joined together, the inner portions of the leads may also be formed as continuous curved sections.

Also, all Examples concern the case where only the leads on the sides of the pellet corresponding to the positions of the so-called short leads are spread. However, the present invention is not limited to this case, and includes a case where leads having long inner portions are spread in a usual semiconductor device. The insulating sheet is not limited to one of a polyimide resin, and may be one of a silicon rubber. A heat-conductive filler such as a silicon carbide powder (SiC) may, of course, be incorporated into the adhesive and/or the insulating sheet in order to improve the heat dissipating ability.

In Examples 1 and 3, the insulating sheet may not necessarily be used. In contrast, in Example 2, an insulating sheet may be used.

The dam for preventing the adhesive cf the leads from flowing out as revealed in Example 2 is not limited to a recess, but may be a protrusion. This kind of dam may, of course, be employed in Examples 1 and 2.

The foregoing description mainly concerns the case where the invention completed by the present inventors is applied to the so-called DIP (Duel In-Line Plastic) type semiconductor device concerned with the application field as the background of the present invention. However, the present invention is not limited to this type of device. The technique of the present invention can be effectively applied to semiconductor devices with various forms of package structures such as a flat package structure in so far as the package is formed by sealing with a resin.

What is claimed is:

1. A semiconductor device comprising:
   (a) a plurality of leads, each lead having an inner portion and an outer portion, the inner portions of said leads extending substantially on one plane;
   (b) a semiconductor pellet having first and second major surfaces being arranged opposed from each other, at least one electronic device being formed on said first major surface, inner portions of a first group of the plurality of leads extending along said second major surface and arranged so that tips of said inner portions of said first group of leads protrude from a side of the pellet to provide bonding points.
   (c) a set of bonding pads disposed on said first major surface along opposite sides of said pellet;
   (d) an insulating sheet inserted between and bonded to the inner portions of the first group of leads and the second major surface for providing electrical insulation;
   (e) a plurality of bonding wires electrically connected between tips of said inner portions of the plurality of leads and said bonding pads;
   (f) a resin sealing body sealing the pellet; the bonding pads, the insulating sheet, the bonding wires and the inner portions of the plurality of leads;
   wherein the plurality of leads further includes a second group of leads, said inner portions of the first group of leads being bent to support said pellet thereon, each inner portion of said first group of leads extending from a non-bonding pad-forming side to a bonding pad-forming side of said pellet and inner portions of said second group of leads being disposed along an end of the pellet without supporting the pellet thereon; and
   wherein the pellet is supported only by said inner portions of said first group of leads.

2. A semiconductor device according to claim 1, wherein the insulating sheet is made of silicon rubber.

3. A semiconductor device according to claim 1, wherein the insulating sheet is made of a polyimide film.

4. A semiconductor device according to claim 1, wherein the insulating sheet is made of an organic material.

5. A semiconductor device according to claim 1, wherein the insulating sheet is made of an organic material other than the material forming the insulating resin body.

6. A semiconductor device according to claim 1, wherein the resin sealing body has a substantially box-like shape and outer lead portions of the leads protrude from at least one of the sides of the body.

7. A semiconductor device according to claim 1, wherein the insulating sheet has sufficient thickness to prevent α-particles from causing malfunction in a circuit including said at least one electronic element formed on one of the major surfaces of the pellet.

8. A semiconductor device comprising:
   (a) a plurality of leads, each lead having an inner portion and an outer portion, the inner portions of said leads extending substantially on one plane;
   (b) a semiconductor pellet having first and second major surfaces being arranged opposed from each other, at least one electronic device being formed on said first major surface, inner portions of a first group of the plurality of leads extending along said first major surface;
   (c) a set of bonding pads disposed on said first major surface along opposite sides of said pellet;
   (d) an insulating sheet inserted between and bonded to the inner portions of the first group of leads and the first major surface for providing electrical insulation;
   (e) a plurality of bonding wires electrically connected between tips of said inner portions of the plurality of leads and said bonding pads;
   (f) a resin sealing body sealing the pellet, the bonding pads, the insulating sheet, the bonding wires and the inner portions of said plurality of leads;
   wherein said plurality of leads further includes a second group of leads, said inner portions of said first group of leads being bent to support said pellet thereunder, each inner portion of said first group of leads extending from a non-bonding pad-forming side to a bonding pad-forming side of said pellet and inner portions of said second group of leads being disposed along an end of the pellet without supporting the pellet thereunder; and wherein the pellet is supported only by said inner portions of the first group of leads.

9. A semiconductor device according to claim 8, wherein the insulating sheet is made of silicon rubber.

10. A semiconductor device according to claim 8, wherein the insulating sheet is made of a polyimide film.

11. A semiconductor device according to claim 8, wherein the insulating sheet is made of an organic material.

12. A semiconductor device according to claim 8, wherein the insulating sheet is made of an organic material other than the material forming the insulating resin body.

13. A semiconductor device according to claim 8, wherein the resin body has a substantially box-like shape and outer lead portions of the leads protrude from at least one of the sides of the body.

14. A semiconductor device according to claim 8, wherein the insulating sheet has sufficient thickness to prevent α-particles from causing malfunction in a circuit including said at least one electronic element formed on one of the major surfaces of the pellet.

15. A semiconductor device comprising:
   (a) a rectangular semiconductor pellet having a first and a second major surfaces being arranged opposed to each other, at least one electronic device being formed on said first major surface, and said pellet comprising first, second, third and fourth sides;
   (b) a plurality of bonding pads arranged on said first major surface in the vicinity of said third and fourth sides being arranged opposed to each other;
   (c) a plurality of leads, each lead having an inner portion, an end portion and an outer portion, the inner portions extending substantially on one plane and including first, second, third and fourth sets each of which has a plurality of inner portions;
   (d) an insulating sheet inserted between and bonded to the inner portions of said leads and the second major surface of said pellet;
   (e) a plurality of bonding wires each electrically connected between each of the end portions of said inner portions and each of said bonding pads; and
   (f) a resin sealing means sealing the pellet, the bonding pads, the insulating sheet, the bonding wires and the inner portions of said plurality of leads;
   wherein said first set of inner portions intersect the first and the third sides of said pellet, and said end portions of said first set of inner portions protrude from the third side of said pellet;
   said second set of inner portions intersect the first and the fourth sides of said pellet, and said end portions of said second set of inner portions protrude from the fourth side of said pellet;
   said third set of inner portions intersect the second and the third sides of said pellet, and said end portions of said third set of inner portions protrude from the third side of said pellet; and
   said fourth set of inner portions intersect the second and the fourth sides of said pellet, and said end portions of said fourth set of inner portions protrude from the fourth side of said pellet.

16. A semiconductor device according to claim 15, wherein said pellet is supported only by said inner portions.

17. A semiconductor device according to claim 15, wherein the insulating sheet is made of silicone rubber.

18. A semiconductor device according to claim 15, wherein the insulating sheet is made of a polyimide film.

19. A semiconductor device according to claim 15, wherein the insulating sheet is made of an organic material.

20. A semiconductor device according to claim 15, wherein the insulating sheet is made of an organic material other than the material forming the insulating resin body.

21. A semiconductor device according to claim 15, wherein the resin sealing body has a substantially box-like shape and outer lead portions of the leads protrude from at least one of the sides of the body.

22. A semiconductor device according to claim 41, further comprising:
   (g) another set of inner portions of said leads arranged along said third and fourth sides of said pellet without supporting the pellet thereon.

23. A semiconductor device comprising:
   (a) a rectangular semiconductor pellet having a first and a second major surfaces being arranged opposed to each other, at least one electronic device being formed on said first major surface, and said pellet comprising first, second, third and fourth sides;
   (b) a plurality of bonding pads arranged on said first major surface in the vicinity of said third and fourth sides being arranged opposed to each other;
   (c) a plurality of leads, each lead having an inner portion, an end portion and an outer portion, the inner portions extending substantially on one plane and including first, second, third and fourth sets each of which has a plurality of inner portions;
   (d) an insulating sheet inserted between and bonded to the inner portions of said leads and the first major surface of said pellet;
   (e) a plurality of bonding wires each electrically connected between each of said end portions of said inner portions and each of said bonding pads; and
   (f) a resin sealing means sealing the pellet, the bonding pads, the insulating sheet, the bonding wires and the inner portions of said plurality of leads;
   wherein said first set of inner portions intersect the first side of said pellet, and said end portions of said first set of inner portions extend to the bonding pads which are arranged in the vicinity of said third side of said pellet;
   said second set of inner portions intersect the first side of said pellet, and said end portions of said second set of inner portions extend to the bonding pads which are arranged in the vicinity of said fourth side of said pellet;
   said third set of inner portions intersect the second side of said pellet, and said end portions of said third set of inner portions extend to the bonding pads which are arranged in the vicinity of said third side of said pellet; and
   said fourth set of inner portions intersect the second side of said pellet, and said end portions of said fourth set of inner portions extend to the bonding pads which are arranged in the vicinity of said fourth side of said pellet.

24. A semiconductor device according to claim 23, wherein said pellet is supported only by said inner portions.

25. A semiconductor device according to claim 23, wherein the insulating sheet is made of silicone rubber.

26. A semiconductor device according to claim 23, wherein the insulating sheet is made of a polyimide film.

27. A semiconductor device according to claim 23, wherein the insulating sheet is made of an organic material.

28. A semiconductor device of according to claim 23, wherein the insulating sheet is made of an organic material other than the material forming the insulating resin body.

29. A semiconductor device according to claim 23, wherein the resin sealing body has a substantially box-like shape and outer lead portions of the leads protrude from at least one of the sides of the body.

30. A semiconductor device according to claim 23, further comprising:
(g) another set of inner portions of said leads arranged along said third and fourth sides of said pellet without supporting the pellet thereunder.

31. A semiconductor device comprising:
(a) an oblong semiconductor pellet having a first and a second major surfaces being arranged opposed to each other, at least one electronic device being formed on said first major surface;
(b) a plurality of bonding pads arranged on said first major surface;
(c) a plurality of leads each lead having an inner portion, an outer portion and an end portion, the inner portions extending substantially on one plane, said inner portions entering from a longer side of said pellet, the end portions of said inner portions extending to said bonding pads;
(d) an insulating sheet inserted between and bonded to the inner portions of said leads and the second major surface of said pellet;
(e) a plurality of bonding wires each electrically connected between each of the end portions of said inner portions and said bonding pads; and
(f) a resin sealing means sealing the pellet, the bonding pads, the insulating sheet, the bonding wires and the inner portions of said plurality of leads.

32. A semiconductor device according to claim 31, wherein said pellet is supported only by said inner portions.

33. A semiconductor device according to claim 31, wherein the insulating sheet is made of silicone rubber.

34. A semiconductor device according to claim 31, wherein the insulating sheet is made of a polyimide film.

35. A semiconductor device according to claim 31, wherein the insulating sheet is made of an organic material.

36. A semiconductor device according to claim 31, wherein the insulating sheet is made of an organic material other than the material forming the insulating resin body.

37. A semiconductor device according to claim 31, wherein the resin sealing body has a substantially box-like shape and outer lead portions of the leads protrude from at least one of the sides of the body.

38. A semiconductor device according to claim 31, further comprising:
(g) another set of inner portions of said leads arranged along said third and fourth sides of said pellet without supporting the pellet thereon.

* * * * *